(12) United States Patent
Hayashi

(10) Patent No.: US 10,120,116 B2
(45) Date of Patent: *Nov. 6, 2018

(54) LIGHT-EMITTING APPARATUS AND LIGHT-EMITTING APPARATUS SYSTEM

(71) Applicant: PANASONIC INTELLECTUAL PROPERTY MANAGEMENT CO., LTD., Osaka (JP)

(72) Inventor: Shintaro Hayashi, Hyogo (JP)

(73) Assignee: PANASONIC INTELLECTUAL PROPERTY MANAGEMENT CO., LTD., Osaka (JP)

( * ) Notice: Subject to any disclaimer, the term of this patent is extended or adjusted under 35 U.S.C. 154(b) by 0 days.

This patent is subject to a terminal disclaimer.

(21) Appl. No.: 15/658,618

(22) Filed: Jul. 25, 2017

(65) Prior Publication Data

US 2018/0031750 A1    Feb. 1, 2018

(30) Foreign Application Priority Data

Jul. 28, 2016    (JP) .................................. 2016-148989

(51) Int. Cl.
*G01J 1/00* (2006.01)
*F21V 8/00* (2006.01)
(Continued)

(52) U.S. Cl.
CPC ............... *G02B 6/001* (2013.01); *F21V 9/08* (2013.01); *F21V 9/30* (2018.02); *G02B 6/4206* (2013.01);
(Continued)

(58) Field of Classification Search
CPC .... G01J 1/4257; G01J 1/42; G01J 1/02; G01J 2001/4247; G01J 1/04
(Continued)

(56) References Cited

U.S. PATENT DOCUMENTS 6,292,003 B1 * 9/2001 Fredrickson ......... G01R 1/0483
324/750.25
6,710,798 B1 * 3/2004 Hershel .............. G01R 31/2887
324/750.23
(Continued)

FOREIGN PATENT DOCUMENTS

JP          5-027121       2/1993
JP          2006-3598      1/2006
JP          2012-216438    11/2012

*Primary Examiner* — Md M Rahman
(74) *Attorney, Agent, or Firm* — Greenblum & Bernstein, P.L.C.

(57) ABSTRACT

A light-emitting apparatus includes: a first light guide which includes a first photoreceptor, a second photoreceptor, and a leak, the first light guide guiding light radiated by a radiation apparatus and received by the first photoreceptor and the second photoreceptor, the leak allowing leakage light to be leaked out, the leakage light being part of the light; a converter which converts a wavelength of the leakage light leaked out of the first light guide; a second light guide which is disposed along the first light guide, the second light guide guiding the light radiated by the radiation apparatus and received by a third photoreceptor to the second photoreceptor; and a protector which is tubular and in which the first light guide and the second light guide are disposed such that the first photoreceptor and the third photoreceptor are disposed at a same open end.

9 Claims, 6 Drawing Sheets

(51) Int. Cl.
  *F21V 9/30*    (2018.01)
  *F21V 9/08*    (2018.01)
  *G02B 6/42*    (2006.01)
  *G02B 6/44*    (2006.01)

(52) U.S. Cl.
  CPC ........... *G02B 6/4295* (2013.01); *G02B 6/443* (2013.01); *G02B 6/0006* (2013.01)

(58) Field of Classification Search
  USPC ........................................................ 356/213
  See application file for complete search history.

(56) References Cited

U.S. PATENT DOCUMENTS

| | | | |
|---|---|---|---|
| 2007/0053043 A1* | 3/2007 | Wada ...................... | B41J 2/473 359/216.1 |
| 2008/0197865 A1* | 8/2008 | Endres ............... | G01R 31/2886 324/754.07 |
| 2013/0207550 A1* | 8/2013 | Nishio ................... | G05D 25/02 315/151 |
| 2014/0092716 A1* | 4/2014 | Saito ...................... | B82Y 35/00 369/53.38 |

* cited by examiner

LIGHT-EMITTING APPARATUS AND LIGHT-EMITTING APPARATUS SYSTEM

CROSS REFERENCE TO RELATED APPLICATION

This application claims the benefit of priority of Japanese Patent Application Number 2016-148989 filed on Jul. 28, 2016, the entire content of which is hereby incorporated by reference.

BACKGROUND

1. Technical Field

The present disclosure relates to a light-emitting apparatus which linearly emits light using laser light as a light source, and a light-emitting apparatus system.

2. Description of the Related Art

Conventionally, there has been a light-emitting apparatus which includes a leak that allows part of light guided into a light guide such as a optical fiber to be leaked out, and which causes a phosphor around the light guide to linearly emit visible light based on the leaked light.

For example, Patent Literature (PTL) 1 (Japanese Unexamined Patent Application Publication No. H5-27121) discloses a technique for achieving surface emission by splitting, by a beam splitter, laser light, into two beams, and causing the two beams of the split laser light to enter the respective both ends of a light guide circularly placed.

Moreover, Patent Literature (PTL) 2 (Japanese Unexamined Patent Application Publication No. 2006-3598) discloses a technique for reducing luminance unevenness of light emission in an extending direction of a light guide, by disposing a radiation apparatus which radiates laser light at each of the both ends of the light guide, and causing the both ends of the light guide to radiate laser light.

SUMMARY

Unfortunately, when a light guide is bent into an elongated U-shape and light is linearly emitted by causing laser light to enter the both ends of the light guide, the both ends of the light guide which emit the strongest light become one end of the whole, and the central part of the light guide which emits the weakest light becomes another end of the whole. In this case, it is not possible to reduce luminance unevenness.

On the other hand, when radiation apparatuses are disposed at the both ends of the light guide, it is necessary to dispose, along the light guide, an electric wire for supplying power to the radiation apparatuses. In this case, the two radiation apparatuses make routing of the light guide difficult.

The present disclosure has an object to provide a light-emitting apparatus and a light-emitting apparatus system which not only ensure luminance evenness but also make routing of a light guide easy when light is linearly emitted using the light guide.

A light-emitting apparatus according to one aspect of the present disclosure is a light-emitting apparatus connected to a radiation apparatus which radiates laser light, the light-emitting apparatus including: a first light guide which includes a first photoreceptor at one end, a second photoreceptor another end, and a leak, the first light guide guiding light radiated by the radiation apparatus and received by the first photoreceptor and the second photoreceptor, the leak allowing leakage light to be leaked out in a direction crossing a light-guiding direction, the leakage light being part of the light; a converter which is disposed along the first light guide and converts a wavelength of the leakage light leaked out of the first light guide; a second light guide which is disposed along the first light guide, includes a third photoreceptor, and does not include the leak, the second light guide guiding the light radiated by the radiation apparatus and received by the third photoreceptor to the second photoreceptor; and a protector which is tubular and in which the first light guide and the second light guide are disposed such that the first photoreceptor and the third photoreceptor are disposed at a same open end.

According to the present disclosure, when linear light is emitted using a light guide, it is possible to ensure luminance evenness and improve routability.

BRIEF DESCRIPTION OF DRAWINGS

The figures depict one or more implementations in accordance with the present teaching, by way of examples only, not by way of limitations. In the figures, like reference numerals refer to the same or similar elements.

DETAILED DESCRIPTION OF THE EMBODIMENTS

Hereinafter, a light-emitting apparatus according to an embodiment of the present disclosure will be described with reference to the drawings. It is to be noted that embodiments and variations to be described below each show a specific example of the present disclosure. The numerical values, shapes, materials, structural elements, the arrangement and connection the structural elements, etc. indicated in the following embodiments and variations are mere examples, and therefore do not intend to limit the present disclosure. Furthermore, among the structural elements in the following embodiments and variations, structural elements not recited in any of the independent claims which indicate the broadest concept of the present; disclosure are described as optional structural elements.

It is also to be noted that the figures are schematic diagrams and are not necessarily precise illustrations. Addi-

Embodiment 1

Figure 1:
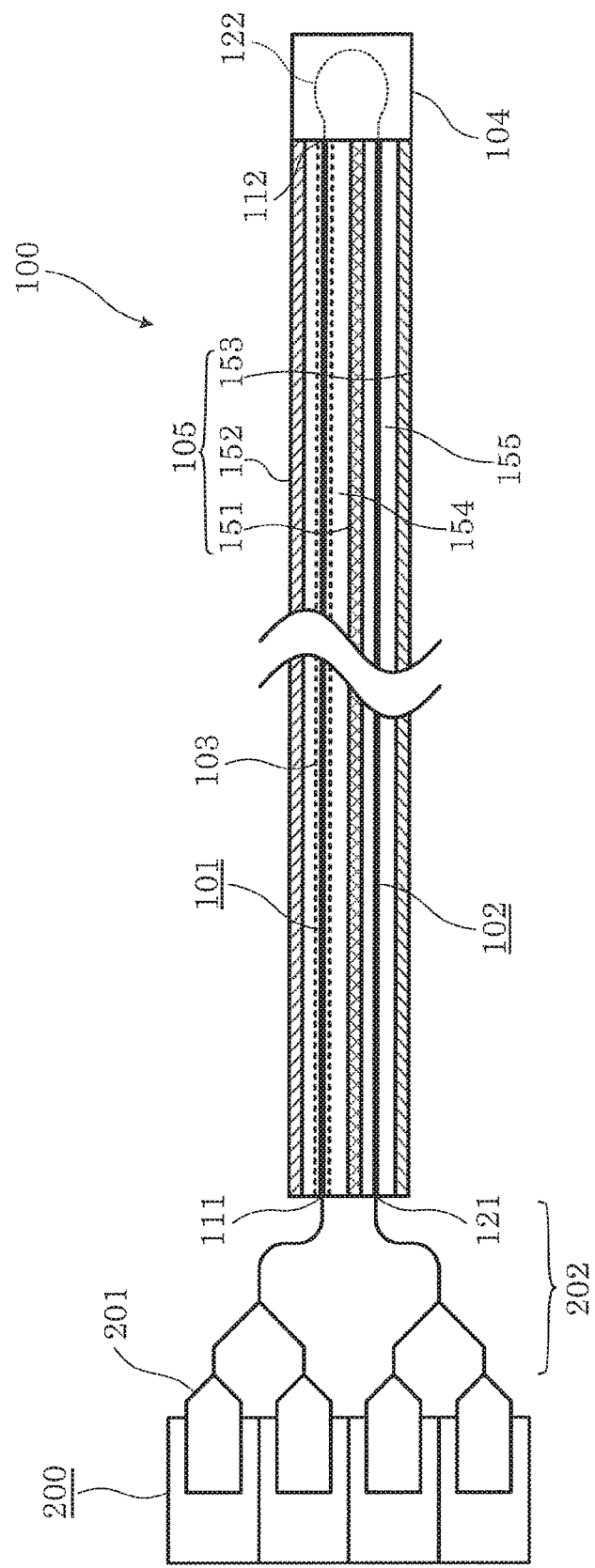
FIG. 1 is a diagram illustrating the configuration of a light-emitting apparatus according to Embodiment 1, together with a radiation apparatus.

FIG. 1 is a diagram illustrating, partially in a cross section, the configuration of a light-emitting apparatus according to Embodiment 1.

Figure 2:
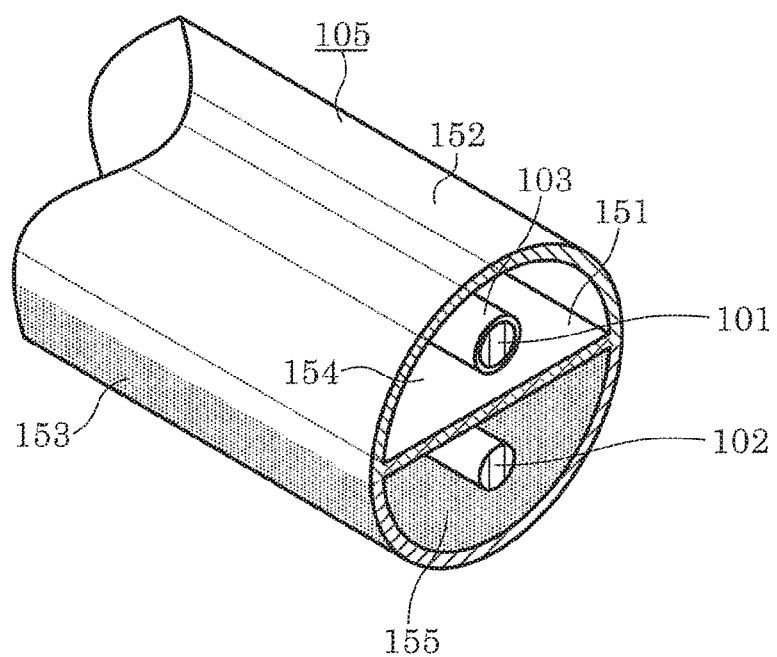
FIG. 2 is a cross-sectional view illustrating a state where the light-emitting apparatus according to Embodiment 1 is cut along a plane perpendicular to an extending direction of a first light guide.

FIG. 2 is a cross-sectional view illustrating a state where the light-emitting apparatus according to Embodiment 1 is cut along a plane perpendicular to an extending direction of a first light guide.

As illustrated in these figures, light-emitting apparatus 100 according to Embodiment 1 illuminates a predetermined space in, for example, a building, a mobile body, an outdoor place, or the like, is used as an indicator lamp, a neon sign, or the like, and is connected to radiation apparatus 200 which radiates laser light. In Embodiment 1, light-emitting apparatus 100 includes first light guide 101, second light guide 102, converter 103, protector 105, and return 104.

[Radiation Apparatus 200]

Radiation apparatus 200 generates laser light to be radiated to converter 103. In Embodiment 1, radiation apparatus 200 includes at least one laser element 201 (four laser elements 201 in Embodiment 1) which emits laser light of a short wavelength selected from a blue-violet to blue (430 nm to 490 nm) range such that converter 103 radiates visible light of a long wavelength. Although laser element 201 is not limited to a particular type, an element which oscillates laser using a semiconductor can be given as an example. Each laser element 201 of radiation apparatus 200 is connected in series to one power supply (not shown), and all laser elements 201 can be stopped from oscillating at once by disconnecting tie power supply or cutting off a power supply line. Laser elements 201 of radiation apparatus 200 are collectively housed in one housing. In addition, radiation apparatus 200 includes waveguide body 202 such that laser light radiated by a half of laser elements 201 reaches first photoreceptor 111 of first light guide 101, and laser light radiated by the other half of laser elements 201 reaches third photoreceptor 121 of second light guide 102.

It is to be noted that radiation apparatus 200 may include a beam splitter which splits laser light radiated by one laser element 201 into two beams of laser light, and may emit the two beams of laser light split by the beam splitter to first photoreceptor 111 of first light guide 101 and third photoreceptor 121 of second light guide 102, respectively.

[Configuration of Light-Emitting Apparatus]

[First Light Guide 101]

Figure 3:
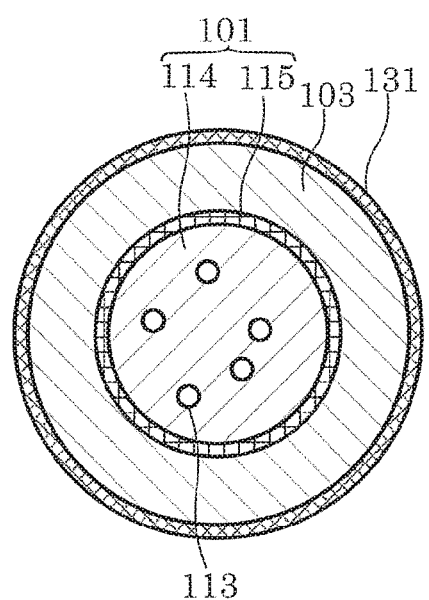
FIG. 3 is a cross-sectional view illustrating a cross section of the first light guide and a converter when cut perpendicular to a light-guiding direction of laser light.

FIG. 3 is a cross-sectional view illustrating a cross section of a first light guide and a converter when cut perpendicular to a light-guiding direction of laser light.

Figure 4:
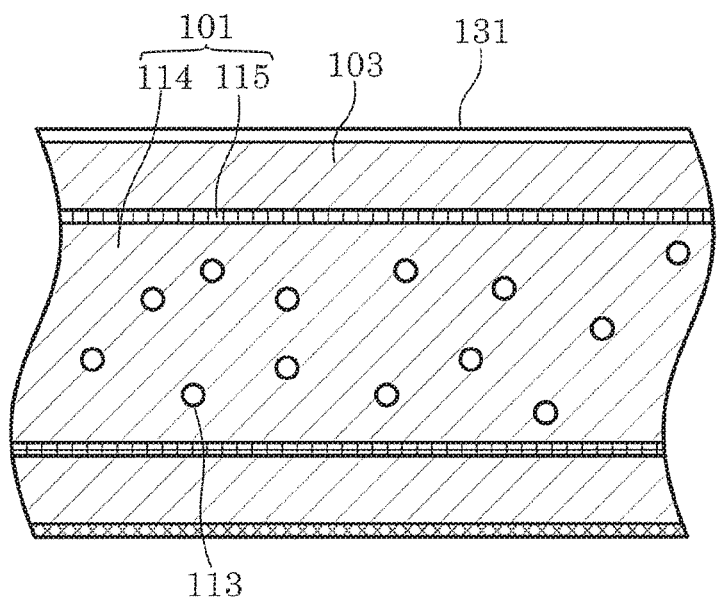
FIG. 4 is a cross-sectional view illustrating a cross section of the first light guide and the converter when cut along the light-guiding direction of the laser light.

FIG. 4 is a cross-sectional view illustrating a cross section of the first light guide and the converter when cut along the light-guiding direction of laser light.

First light guide 101 is capable of guiding laser light radiated by radiation apparatus 200 along a linear path, and includes first photoreceptor 111 at one end and second photoreceptor 112 at another end. In addition, first light guide 101 guides the received laser light and includes leak 113 which allows part of the guided laser light to be leaked out in a direction crossing the light-guiding direction.

In Embodiment 1, first light guide 101 is what is called an optical fiber which is flexible (has flexibility), and includes core 114 and cladding 115. A higher refractive index is set for core 114 than for cladding 115, which allows first light guide 101 to keep laser light inside core 114 by total reflection, and guide the laser light highly efficiently. Core 114 and cladding 115 are made from a material which is highly transmissive of laser light, such as quartz glass and a plastic material like an acryl resin.

[Leak 113]

Leak 113 is a component or structure which allows part of laser light guided by first light guide 101 and passing inside core 114 to be leaked out in a direction crossing the light guiding direction.

In Embodiment 1, leak 13 includes minute beads dispersed inside core 114. The beads have a surface which scatters laser light, and part of the laser light scattered by leak 113 travels in a direction different from the light-guiding direction, and passes through cladding 115 to leak out of first light guide 101.

It is to be noted that leak 113 is not limited to the beads dispersed inside core 114, and may be another component or structure. For example, leak 113 may be cavities (air bubbles) dispersed inside core 114. In addition, leak 113 may be a portion provided in part of cladding 115 and having a refractive index different from that of cladding 115 to avoid total reflection of laser light passing inside core 114.

[Converter 103]

Converter 103 is disposed along first light guide 101 and converts a wavelength of laser light which leak 113 allows to be leaked out of first light guide 101 in a direction crossing the light-guiding direction. In Embodiment 1, converter 103 is what is called a remote phosphor including dispersed phosphor particles which emits fluorescence when excited by laser light leaked out of first light guide 101. Specifically, converter 103 can be exemplified as a component in which phosphor particles are dispersed inside a transparent base material. Moreover, a base material of converter 103 is made of resin etc. which is transparent to laser light and light radiated by phosphors, and bends following a change in the form of first light guide 101.

Although it is sufficient that converter 103 includes at least one type of phosphor, in Embodiment 1, converter 103 includes multiple types of phosphors. More specifically, in order to radiate light of a desired color such as white light using, as excitation light, the laser light of the short wavelength received from radiation apparatus 200, converter 103 includes, in an appropriate ratio, multiple types of phosphors which emit beams of light of a wavelength longer than that of the laser light and of colors such as red, yellow, and green. As stated above, the beams of light having the desired colors can be radiated by the mixing of the beams of light of different wavelengths radiated by the multiple types of the phosphors excited by the laser light of the short wavelength. Here, the term "ratio" includes a ratio in which at least one number is 0.

Although a method for disposing converter 103 along first light guide 101 is not particularly limited, for example, converter 103 may be attached to first light guide 101 by applying a liquid base material (resin) containing phosphors onto the outer circumferential surface of first light guide 101, or converter 103 having a sheet shape or cylindrical shape may be laminated onto first light guide 101.

It is to be noted that phosphors may be included in cladding 115 of first light guide 101, and caused to serve as converter 103 and leak 113.

It is to be noted that at least one of the concentration of phosphor and the ratio among the multiple types of the phosphors may be gradually or continuously varied.

Moreover, converter 103 may include a function film for efficiently irradiating the phosphors with laser light, a function film for efficiently radiating emitted visible light, or the like.

Furthermore, converter 103 may include cover 131 which protects converter 103 from scrapes and scratches. Although a method for forming cover 131 or disposing cover 131 around converter 103 is not particularly limited, a thin flexible resin tube may be disposed in close adhesion around converter 103. Moreover, cover 131 may be formed by applying a liquid resin onto converter 103 and hardening the resin using ultraviolet radiation, heat, etc.

It is to be noted that cover 131 may include a scattering component or structure which scatters laser light to reduce the coherence of laser light leaked out of first light guide 101 and converter 103.

[Second Light Guide 102]

Like first light guide 101, second light guide 102 is capable of guiding laser light radiated by radiation apparatus 200 along a linear path, includes third photoreceptor 121 which receives the laser light, at an end on the side of radiation apparatus 200, and allows second photoreceptor 121 of first light guide 101 to receive the laser light. Moreover, unlike first light guide 101, second light guide 102 does not deliberately include leak 113. Furthermore, second light guide 102 is disposed along first light guide 101. Here, that leak 113 is deliberately included means artificially providing leak 113 in a light guide such as disposing beads inside core 114 as in first light guide 101.

In Embodiment 1, like first light guide 101, second light guide 102 is an optical fiber including core 114 and cladding 115. In addition, second light guide 102 includes curved portion 122 which is curved by approximately the minimum bend radius, on the opposite side of third photoreceptor 121, and the length of second light guide 102 including curved portion 122 is greater than that of first light guide 101.

[Protector 105]

Protector 105 is a flexible tubular component into which first light guide 101 and second light guide 102 are inserted such that first photoreceptor 111 of first light guide 101 and third photoreceptor 121 of second light guide 102 are disposed at the same opening end. Protector 105 allows second light guide 102 to be disposed along first light guide 101, and first light guide 101 and second light guide 102 to appear like one component which linearly emits light. In addition, protector 105 is capable of protecting first light guide 101 and second light guide 102 from a localized pressure or impact from the outside.

Although a material of or a method for producing protector 105 is not particularly limited, protector 105 which can be produced by extrusion molding and part or all of which is made of a transparent silicone resin can be given as an example.

In Embodiment 1, protector 105 includes partition 151 which partitions a space inside protector 105 into first chamber 154 which houses first light to guide 101, and second chamber 155 which houses second light guide 102. Moreover, a surrounding wall of protector 105 on the side of first chamber 154 is transmissive portion 152 which is transparent and capable of transmitting light emitted by converter 103, and a surrounding wall of protector 105 on the side of second chamber 155 is light blocking portion 153 which blocks light involuntarily leaked out of second light guide 102. With this, the light emitted by converter 103 can be transmitted to the outside of protector 105. Furthermore, partition 151 allows first light guide 101 to avoid direct contact with second light guide 102 disposed along first light guide 101, and is capable of reducing damage to these light guides and converter 103.

Moreover, a surface of partition 151 at least on the side of first chamber 154 serves as a reflector which reflects light emitted by converter 103 toward the outside of protector 105. Specifically, partition 151 is opaque white in color, and serves both as the reflector which reflects the light emitted by converter 103, and as the light-blocking portion which blocks the light involuntarily leaked out of second light guide 102.

With this, it is possible to distribute, to the surrounding wall on the side of first chamber 154, light almost evenly emitted in all directions by converter 103 in a plane perpendicular to an extending direction of first light guide 101. In addition, it is possible to achieve a desired color temperature by preventing light leaked out of second light guide 102 being mixed.

Furthermore, the surrounding wall of protector 105 on the side of first chamber 154 includes a scattering portion which scatters laser light. With this, it is possible to reduce the coherence of laser light involuntarily emitted by a break of first light guide 101, and improve safety for the human eye. The scattering portion is not particularly limited, and fine particles may be dispersed in transmissive portion 152 which is the surrounding wall of protector 105 on the side of first chamber 154 or a minute uneven structure may be formed on the external wall surface to scatter laser light.

It is to be noted that examples of a method for producing protector 105 which includes partition 151 and of which the surrounding wall is divided into transmissive portion 152 and light-blocking portion 153 include coinjection molding which integrally extrudes different types of resins.

[Return 104]

Return 104 is disposed on the side of second photoreceptor 112 of first light guide 101, and turns back laser light guided by second light guide 102. In Embodiment 1, return 104 is a highly rigid component which maintains a curved state of curved portion 122 resulting from an end opposite third photoreceptor 121 of second light guide 102 being curved by approximately the minimum bend radius, and which protects curved portion 122 from pressure etc. exerted from the outside. Here, the minimum bend radius of second light guide 102 refers to the minimum bend radius which allows the loss of guided light caused by bending second light guide 102 to be within an allowable range, and is exemplified as being approximately 10 times the diameter of second light guide 102. It is to be noted that the minimum bending radius depends on types or the like of components (e.g., a core and a cladding) included in second light guide 102.

[Advantageous Effects]

As described above, light-emitting apparatus 100 according to the present embodiment makes it possible to easily handle a light-emitting component which linearly emits light, by causing protector 105 to collectively protect first light guide 101, converter 103 disposed along first light guide 101, and second light guide 102. Moreover, because one end of light-emitting apparatus 100 is connected to radiation apparatus 200 and another end of the same can be freely moved, it is possible to freely dispose light-emitting apparatus 100, and cause light-emitting apparatus 100 to emit linear light in any pattern such as a character. Here, the term linear refers not only to rectilinear but also to curved, meandering, zigzag, annular, etc. Moreover, because laser light is received by each of first photoreceptor 111 and second photoreceptor 112 and guided in an opposite direction, light-emitting apparatus 100 makes it possible to reduce luminance unevenness of the visible light in the extending direction of first light guide 101.

Moreover, because return component 104 protects curved portion 122 of second light guide 102 which has relatively inadequate structural strength, it is possible to increase the structural strength of whole light-emitting apparatus 100 and to dispose light-emitting apparatus 100 on a floor surface or the like to which pressure is applied from the outside.

Embodiment 2

Next, another embodiment of light-emitting apparatus 100 will be described. It is to be noted that the same reference signs are assigned to components (portions) having the same operation, function, shape, mechanism, or structure as in Embodiment 1, and description thereof may be omitted. Moreover, hereinafter, description will center on points different from those of Embodiment 1, and description of the identical matters may be omitted.

Figure 5:
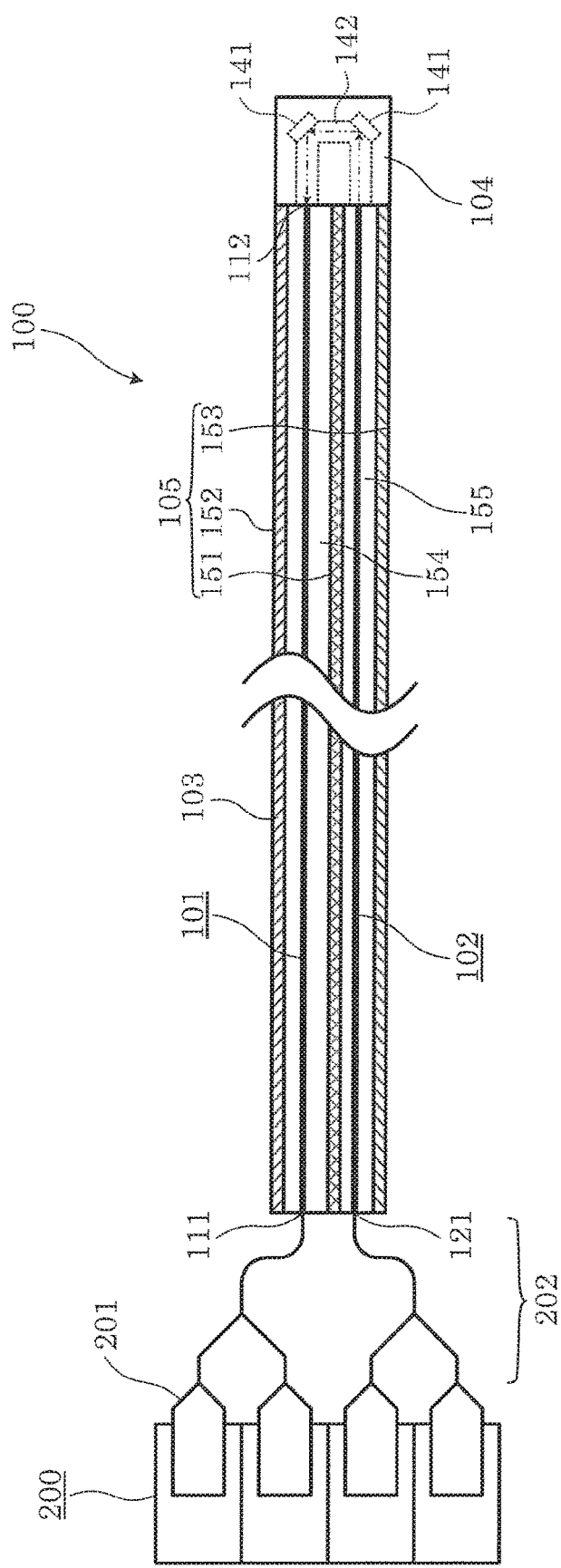
FIG. 5 is a diagram illustrating, partially in a cross section, the configuration of a light-emitting apparatus according to Embodiment 2, together with a radiation apparatus.

FIG. 5 is a diagram illustrating, partially in a cross section, the configuration of a light-emitting apparatus according to Embodiment 2.

As illustrated in the figure, light-emitting apparatus 100 according to Embodiment 2 is connected to radiation apparatus 200 which radiates laser light, as in Embodiment 1, and includes first light guide 101, second light guide 102, converter 103, and return 104. Moreover, light-emitting apparatus 100 includes protector 105.

[First Light Guide 101]

First light guide 101 according to Embodiment 2 is the same as the one in Embodiment 1. It is to be noted that in Embodiment 2, converter 103 is not attached to first light guide 101.

[Second Light Guide 102]

Second light guide 102 according to Embodiment 2 does not include curved portion 122 and has an end which is opposite third photoreceptor 121 and connected to return 104. Moreover, second light guide 102 has almost the same length as first light guide 101, because second light guide 102 does not include curved portion 122.

[Converter 103]

Figure 6:
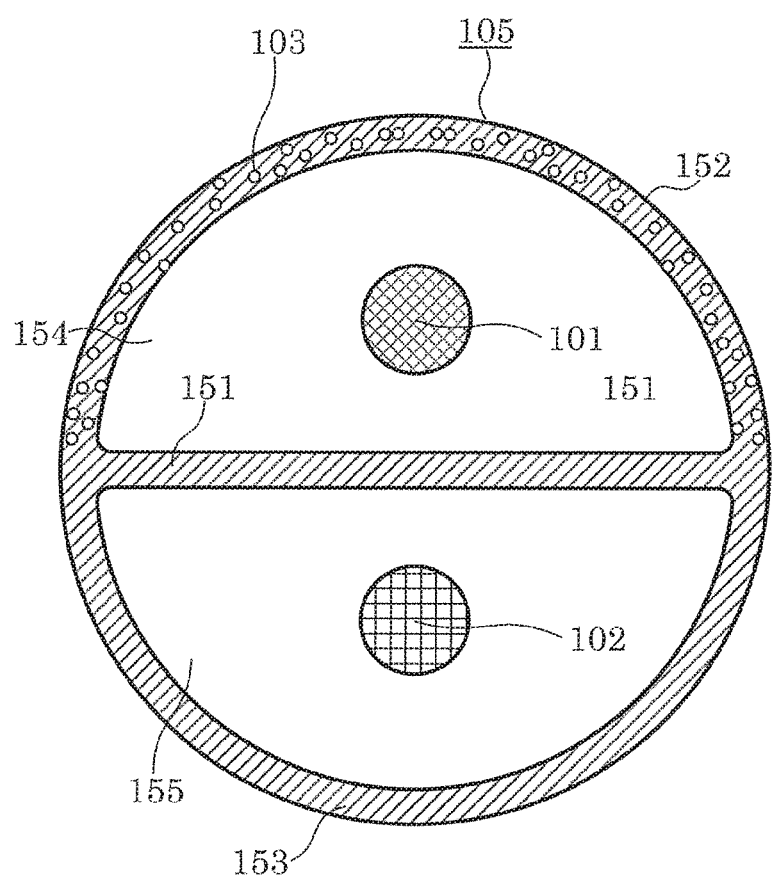
FIG. 6 is a cross-sectional view illustrating a state where the light-emitting apparatus according to Embodiment 2 is cut along a plane perpendicular to an extending direction of a first light guide.

As illustrated in FIG. 6, converter 103 is provided to the surrounding wall of protector 105 on the side of first chamber 154. Specifically, phosphor particles which are excited by laser light leaked out of first light guide 101 are dispersed in protector 105.

[Return 104]

Return 104 includes: reflector 141 which returns light radiated by second light guide 102, to second photoreceptor 112 of first light guide 101, by reflecting the light; and cavity 142 through which laser light passes.

Reflector 141 is a mirror capable of reflecting laser light radiated by radiation apparatus 200. In Embodiment 2, two reflectors 141 are separately provided inside return 104 so as to cause laser light emitted by second light guide 102 to enter second photoreceptor 112 by reflecting the laser light twice. Moreover, cavity 142 is formed in a U-shape inside return 104 so as not to interfere with the laser light reflected by reflectors 141.

Moreover, protector 105 is bonded to return 104 at one end of protector 105. This makes it possible to protect first light guide 101 and second light guide 102 more firmly.

[Advantageous Effects]

As described above, light-emitting apparatus 100 according to Embodiment 2 produces the following advantageous effects in addition to or instead of the advantageous effects produced by light-emitting apparatus 100 according to Embodiment 1.

Because return component 104 including reflector 141 makes it possible to return laser light emitted by second light guide to second photoreceptor 112 of first light guide 101 regardless of the minimum bend radius of second light guide 102 or the like, it is possible to dispose second light guide 102 in the proximity of first light guide 101.

[Others]

It is to be noted that the present invention is not limited to the aforementioned embodiments. For example, other embodiments which can be realized by combing any of the structural elements described in the present description or by excluding some of the structural elements may be embodiments of the present invention. Furthermore, variations obtainable through various modifications to the aforementioned embodiments which can be conceived by a person skilled in the art without departing from the essence of the present invention, that is, the meaning of the recitations in the claims are included in the present invention.

For example, although first chamber 154 and second chamber 155 into which first light guide 101 and second light guide 102 are inserted respectively are illustrated as being large relative to the diameter of these light guides, protector 105 may hold at least one of first light guide 101 and second light guide 102 in close adhesion.

Moreover, although reflector 141 has been described as being integral with partition 151, for example, a tape-like film on which metal is deposited and which has high reflecting properties may be inserted into protector 105 and be used as reflector 141.

Furthermore, instead of causing the surrounding wall of protector 105 which forms second chamber 155 to serve as light-blocking portion 153, a tubular component which can be inserted into protector 105 and has light-blocking properties may be used as light-blocking portion 153. In this case, the inside of the tubular component forms second chamber 155, and a surrounding wall of the tubular component also serves as partition 151.

Moreover, irregularities for controlling light distribution may be formed in the outer surface or inner surface of protector 105, and a component including irregularities may be separately attached to protector 105.

While the foregoing has described one or more embodiments and/or other examples, it is understood that various modifications may be made therein and that the subject matter disclosed herein may be implemented in various forms and examples, and that, they may be applied in numerous applications, only some of which have been described herein. It is intended by the following claims to claim any and all modifications and variations that fall within the true scope of the present teachings.

What is claimed is:

1. A light-emitting apparatus connected to a radiation apparatus which radiates laser light, the light-emitting apparatus comprising:
   a first light guide which includes a first photoreceptor at one end, a second photoreceptor at another end, and a leak, the first light guide guiding light radiated by the radiation apparatus and received by the first photoreceptor and the second photoreceptor, the leak allowing leakage light to be leaked out in a direction crossing a light-guiding direction, the leakage light being part of the light;

a converter which is disposed along the first light guide and converts a wavelength of the leakage light leaked out of the first light guide;

a second light guide which is disposed along the first light guide, includes a third photoreceptor, and does not include the leak, the second light guide guiding the light radiated by the radiation apparatus and received by the third photoreceptor to the second photoreceptor; and a protector which is tubular and in which the first light guide and the second light guide are disposed such that the first photoreceptor and the third photoreceptor are disposed at a same open end.

2. The light-emitting apparatus according to claim 1, wherein the protector includes a partition which partitions a space inside the protector into a first chamber which houses the first light guide and a second chamber which houses the second light guide.

3. The light-emitting apparatus according to claim 2, wherein the protector includes a light-blocking portion which blocks light leaked out of the second light guide.

4. The light-emitting apparatus according to claim 1, wherein the protector includes a reflector which reflects light emitted by the converter, toward an outside of the protector.

5. The light-emitting apparatus according to claim 1, wherein the protector includes the converter in a surrounding wall on a side of the first chamber.

6. The light-emitting apparatus according to claim 1, wherein the protector includes a scattering portion which scatters the laser light toward the first chamber.

7. The light-emitting apparatus according to claim 1, further comprising a return which is disposed on a side of the second photoreceptor of the first light guide and turns back light guided by the second light guide.

8. The light-emitting apparatus according to claim 7, wherein the return is connected to an end of the protector.

9. A light-emitting apparatus system, comprising:

a radiation apparatus which radiates laser light;

a first light guide which includes a first photoreceptor at one end, a second photoreceptor at another end, and a leak, the first light guide guiding light radiated by the radiation apparatus and received by the first photoreceptor and the second photoreceptor, the leak allowing leakage light to be leaked out in a direction crossing a light-guiding direction, the leakage light being part of the light;

a converter which is disposed along the first light guide and converts a wavelength of the leakage light leaked out of the first light guide;

a second light guide which is disposed along the first light guide, includes a third photoreceptor, and does not include the leak, the second light guide guiding the light radiated by the radiation apparatus and received by the third photoreceptor to the second photoreceptor; and a protector which is tubular and in which the first light guide and the second light guide are disposed such that the first photoreceptor and the third photoreceptor are disposed at the same open end.

* * * * *